United States Patent
Siddik et al.

(10) Patent No.: US 10,439,131 B2
(45) Date of Patent: Oct. 8, 2019

(54) METHODS OF FORMING SEMICONDUCTOR DEVICES INCLUDING TUNNEL BARRIER MATERIALS

(71) Applicant: Micron Technology, Inc., Boise, ID (US)

(72) Inventors: Manzar Siddik, Singapore (SG); Witold Kula, Gilroy, CA (US); Suresh Ramarajan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/597,903

(22) Filed: Jan. 15, 2015

(65) Prior Publication Data
US 2016/0211440 A1  Jul. 21, 2016

(51) Int. Cl.
H01L 43/12   (2006.01)
H01L 43/08   (2006.01)
G11C 11/16  (2006.01)

(52) U.S. Cl.
CPC ............ H01L 43/08 (2013.01); G11C 11/161 (2013.01); H01L 43/12 (2013.01)

(58) Field of Classification Search
CPC .................................................. H01L 438/03
See application file for complete search history.

(56) References Cited

U.S. PATENT DOCUMENTS 4,882,936 A   11/1989  Garshelis
5,551,586 A   9/1996   Uenoyama et al.
(Continued)

FOREIGN PATENT DOCUMENTS

CN   101162756 A   4/2008
CN   101395732 A   3/2009
(Continued)

OTHER PUBLICATIONS

Hiroki et al., Tunnel Magnetoresistance above 170% and Resistance-Area Product of 1 ohm (micrometer)2 Attained by In Situ Annealing of Ultra-Thin MgO Tunnel Barrier, Mar. 10, 2011, Applied Physics Express 4 (2011) 033002 1-3.*
(Continued)

*Primary Examiner* — Kenneth Parker
*Assistant Examiner* — Christopher A Culbert
(74) *Attorney, Agent, or Firm* — TraskBritt

(57) ABSTRACT

A semiconductor device comprises an array of magnetic cell structures each comprising a magnetic tunnel junction over an electrode on a substrate. Each of the magnetic tunnel junctions includes a magnetic material over the substrate, a first tunnel barrier material over the magnetic material, a second tunnel barrier material over the annealed first tunnel barrier material, and another magnetic material over the second tunnel barrier material. Each magnetic tunnel junction is configured to exhibit a tunnel magnetoresistance greater than or equal to about 180% at a resistance area product of less than about 8 ohm $\mu m^2$. The semiconductor device also includes another electrode over the another magnetic material. Semiconductor devices including the magnetic tunnel junctions, methods of forming the magnetic tunnel junctions, and methods of forming semiconductor devices including the magnetic tunnel junctions are disclosed.

19 Claims, 8 Drawing Sheets

(56) References Cited

U.S. PATENT DOCUMENTS

| | | |
|---|---|---|
| 5,563,000 A | 10/1996 | Tukaram et al. |
| 5,565,266 A | 10/1996 | Hatwar et al. |
| 5,583,725 A | 12/1996 | Coffey et al. |
| 5,604,030 A | 2/1997 | Yamane |
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Tetsuya et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota |
| 6,964,819 B1 | 11/2005 | Girt |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1* | 2/2009 | Lin ............ B82Y 10/00 257/E21.663 |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2* | 7/2013 | Cao ............ H01L 43/12 438/3 |
| 8,514,527 B2 | 8/2013 | Komagaki et al. |
| 8,545,999 B1 | 10/2013 | Leng et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,790,798 B2 | 7/2014 | Shukh |
| 8,803,265 B2 | 8/2014 | Lim et al. |
| 8,823,118 B2 | 9/2014 | Horng et al. |
| 8,854,876 B2 | 10/2014 | Uchida et al. |
| 8,923,038 B2 | 12/2014 | Kula et al. |
| 9,269,888 B2 | 2/2016 | Meade et al. |
| 9,373,780 B2 | 6/2016 | Jan et al. |
| 9,466,789 B2 | 10/2016 | Wang et al. |
| 9,472,752 B2 | 10/2016 | Wang et al. |
| 9,705,075 B2 | 7/2017 | Lim et al. |
| 9,786,841 B2 | 10/2017 | Siddik et al. |
| 10,014,466 B2 | 7/2018 | Siddik et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0142562 A1 | 7/2003 | Kreupl |
| 2003/0199104 A1 | 10/2003 | Leuschner et al. |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0098354 A1 | 5/2006 | Parkin |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026260 A1 | 2/2007 | Nemoto et al. |
| 2007/0026263 A1 | 2/2007 | Kubota |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0201265 A1 | 8/2007 | Ranjan et al. |
| 2007/0217071 A1 | 9/2007 | Inamura et al. |
| 2007/0247756 A1 | 10/2007 | Lai et al. |
| 2007/0253116 A1 | 11/2007 | Takahashi |
| 2007/0297220 A1 | 12/2007 | Yoshikawa et al. |

(56) References Cited

U.S. PATENT DOCUMENTS

| | | |
|---|---|---|
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0198512 A1 | 8/2008 | Mukai |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2010/0328822 A1 | 12/2010 | Park et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1 | 1/2012 | Lim et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0181537 A1 | 7/2012 | Cao et al. |
| 2012/0205758 A1 | 8/2012 | Jan et al. |
| 2012/0217594 A1 | 8/2012 | Kajiyama |
| 2012/0217599 A1 | 8/2012 | Nam et al. |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0241879 A1 | 9/2012 | Ikeno et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0015539 A1 | 1/2013 | Choi |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0236639 A1 | 9/2013 | Carey et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0313665 A1 | 11/2013 | Rhie et al. |
| 2013/0314815 A1 | 11/2013 | Yuan et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |

(56) References Cited

U.S. PATENT DOCUMENTS

| | | | |
|---|---|---|---|
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1 | 11/2014 | Kim et al. |
| 2014/0367814 A1 | 12/2014 | Ohmori et al. |
| 2015/0028439 A1 | 1/2015 | Kula et al. |
| 2015/0041933 A1 | 2/2015 | Chepulskyy et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0179916 A1* | 6/2015 | Pramanik ............ H01L 39/2493 505/190 |
| 2015/0249202 A1 | 9/2015 | Siddik et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0111632 A1 | 4/2016 | Sandhu et al. |
| 2016/0155932 A1 | 6/2016 | Chen et al. |

FOREIGN PATENT DOCUMENTS

| | | | |
|---|---|---|---|
| CN | 101461064 A | 6/2009 |
| CN | 102246327 A | 11/2011 |
| CN | 102610270 A | 7/2012 |
| CN | 104241286 A | 12/2014 |
| EP | 1353443 A2 | 10/2003 |
| EP | 1885006 A1 | 2/2008 |
| EP | 2385548 A1 | 11/2011 |
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2004179668 A | 6/2004 |
| JP | 2006165059 A | 6/2006 |
| JP | 2007173843 A | 7/2007 |
| JP | 2008010590 A | 1/2008 |
| JP | 2008192926 A | 8/2008 |
| JP | 2008198792 A | 8/2008 |
| JP | 2008270835 A | 11/2008 |
| JP | 2009194366 A | 8/2009 |
| JP | 2010087355 A | 4/2010 |
| JP | 2010093157 A | 4/2010 |
| JP | 2011119755 A | 6/2011 |
| JP | 2011521391 A | 7/2011 |
| JP | 2012064624 A | 3/2012 |
| JP | 2012-099816 A | 5/2012 |
| JP | 2012142480 A | 7/2012 |
| JP | 2012519957 A | 8/2012 |
| JP | 2012204432 A | 10/2012 |
| JP | 2012244031 A | 12/2012 |
| JP | 2013145846 A | 7/2013 |
| JP | 2013156846 A | 8/2013 |
| JP | 2014-003313 A | 1/2014 |
| KR | 1020040092342 A | 11/2004 |
| KR | 1020070094431 A | 9/2007 |
| KR | 1020080029852 A | 4/2008 |
| KR | 1020120008295 A | 1/2012 |
| KR | 1020120130701 A | 12/2012 |
| WO | 2010/026667 A1 | 3/2010 |
| WO | 2010026831 A1 | 3/2010 |
| WO | 2010134378 A1 | 11/2010 |
| WO | 2010137679 A1 | 12/2010 |
| WO | 2011001746 A1 | 1/2011 |
| WO | 2011149274 A2 | 12/2011 |
| WO | 2011159422 A1 | 12/2011 |
| WO | 2012086183 A | 6/2012 |
| WO | 2012128891 A1 | 9/2012 |
| WO | 2012160937 A1 | 11/2012 |
| WO | 2013176332 A1 | 11/2013 |
| WO | 2013191920 A1 | 12/2013 |
| WO | 2014097520 A1 | 6/2014 |

OTHER PUBLICATIONS

Hiroki Maehara, Tunnel Magnetoresistance above 170% and Resistance-Area Product of 1 Ohm(micrometer)2 Attained by In Situ Annealing of Ultra-Thin MgO Tunnel Barrier, 2011, Applied Physics Express 4, 033002.*

Ando et al., "Electrically Tunable Spin Injector Free from the Impedence Mismatch Problem," Nature Materials, vol. 10 (Sep. 2011), pp. 655-659.

Butler et al, "Spin-Dependent Tunneling Conductance of Fe|MgO|Fe Sandwiches," Physical Review B, vol. 63, (Jan. 8, 2001), 054416-1-054416-12.

Chen et al, Magnetic Cell Structures, and Methods of Fabrication, U.S. Appl. No. 14/558,367, filed Dec. 2, 2014.

Kaufman, Myron, "Principles of Thermodynamics," Taylor & Francis Group LLC, (2002), Chap. 7: Chemical Reactions, 9 pages.

"Knovel Sampler," Knovel, (2003), http://app.knovel.com/web/view/html/show.v/rcid:kpKS000009/cid:kt003BCMZ2/viewerType:html/root_slug:front-matter/url_slug:front-matter?b-q=ioniz . . .; 2 pages.

Meade et al., Memory Cells, Methods of Fabrication, and Semiconductor Devices, U.S. Appl. No. 14/256,655, filed Apr. 18, 2014.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Piramanayagam, S. N., Perpendicular Recording Media for Hard Disk Drives, Journal of Applied Physics, vol. 102, (2007), pp. 011301-1-011301-22.

Sandhu et al., Memory Cells, Semiconductor Devices, and Methods of Fabrication, U.S. Appl. No. 14/516,347, filed Oct. 16, 2014.

Miao et al., "Theoretical investigation on the transition-metal borides with Ta3B4-type structure: A class of hard and refractory materials," 2011, Computational Materials Science, Elsevier, pp. 1559-1566.

Greenwood et al, Chemistry of Elements, Second Edition, (1997), pp. 23-25.

Wang et al., "Low-Power Non-volatile Spintronic Memory: STT-MRAM and Beyond," J. Phys. D: Applied Physics, vol. 46, (Jan. 31, 2013), pp. 1-10.

International Search Report for International Application No. PCT/US2015/066828 dated Apr. 11, 2016, 3 pages.

Hindmarch et al, "Zirconium as a Boron Sink in Crystalline CoFeB/MgO/CoFeB Magnetic Tunnel Junctions," Applied Physics Express, vol. 4, (2011), pp. 013002-1-013002-3.

Kurt et al., "Giant Tunneling Magnetoresistance with Electron Beam Evaporated MgO Barrier and CoFeB Electrodes," Journal of Applied Physics, No. 107, (Apr. 30, 2010), pp. 083920-1-083920-6.

Yu et al., 1/f Noise in MgO Double-Barrier Magnetic Tunnel Junctions, Applied Physics Letters, vol. 98, (2011), pp. 112504-1-112504-3.

Zhang, Anisotropic Magnetomechanical Effect in Tb0.3Dy0.7Fe2 Alloy, Journal of Magnetism and Magnetic Materials, vol. 324, (2012), pp. 190-195.

Zhu et al., Magnetic Tunnel Junctions, MaterialsToday, vol. 9, No. 11, (Nov. 2006), pp. 36-45.

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

Auwarter et al., Co on h-Bn/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

(56) References Cited

OTHER PUBLICATIONS

Braun et al., Magnetism and Strain-Induced Perpendicular Magnetic Anisotropy in Ultrathin Ni Films on Cu3Au(0 0 1), Journal of Magnetic Materials, vol. 171, (1997), pp. 16-28.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al, Atomic-Scale Spectroscopic Imaging of CoFeB/Mg—B—O/CoFeB Magnetic Tunnel Junctions, Applied Physics Letters, vol. 95, (2009), pp. 032506-1-032506-3.
Chen et al., Advances and Future Prospects of Spin-Transfer Torque Random Access Memory, IEEE Transactions on Magnetics, vol. 26, No. 6, (Jun. 2010), pp. 1873-1878.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), abstract only, 2 pages.
Farle et al., The Temperature Dependence of Magnetic Anisotropy in Ultra-Thin Films, Journal of Magnetism and Magnetic Materials, vol. 165, (1997), pp. 74-77.
Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.
Heczko et al., Strain and Concurrent Magnetization Changes in Magnetic Shape Memory Ni—Mn—Ga Single Crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
Ke et al., Oxygen-Vacancy-Induced Diffusive Scatting in Fe/MgO/Fe Magnetic Tunnel Junctions, Physical Review Letters, vol. 105, Dec. 3, 2010, pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), abstract, 1 page.
Ko et al, Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kula et al., Memory Cells, Methods of Fabrication, Semiconductor Device Structures, Memory Systems, and Electronic Systems, U.S. Appl. No. 13/948,839, filed Jul. 23, 2014.
Lavrijsen et al, Tuning the Interlayer Exchange Coupling Between Single Perpendicularly Magnetized CoFeB Layers, Appl. Phys. Lett., vol. 100, (2012), pp. 052411-1-052411-5.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara et al., Tunnel Magnetoresistance Above 170% and Resistance-Area Product of 1 $\Omega(\mu m)2$ Attained by in Situ Annealing of Ultra-Thin MgO Tunnel Barrier, Applied Physics Express, vol. 4, (2011), abstract only, 2 pages.
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miracle et al., An Assessment of Binary Metallic Glasses: Correlations Between Structure, Glass Forming Ability and Stability (Preprint), Air Force Research Laboratory, (2011), 97 pages.
Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.
Moroz et al., Modeling the Impact of Stress on Silicon Processes and Devices, Materials Science in Semiconductor Processing, vol. 6, (2003), pp. 27-36.
Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.
Nishitani et al., Magnetic Anisotropy in a Ferromagnetic (Ga,Mn)Sb Thin Film, Physica E, vol. 42, (2010), pp. 2681-2684.
Resnik et al., Mechanical Stress in Thin Film Microstructures on Silicon Substrate, Vacuum, vol. 80, (2005), pp. 236-240.
Sandhu et al., Memory Cells, Methods of Fabrication, Semiconductor Devices, Memory Systems, and Electronic Systems, U.S. Appl. No. 14/026,627, filed Sep. 13, 2013.
Sandhu et al., Memory Cells, Semiconductor Structures, Semiconductor Devices, and Methods of Fabrication, U.S. Appl. No. 14/249,183, filed Apr. 9, 2014.
Sato et al., Perpendicular-Anisotropy CoFeB-MgO Magnetic Tunnel Junctions with a MgO/CoFeB/Ta/CoFeB/MgO Recording Structure, Applied Physics Letters, vol. 101, (2012), pp. 022414-1-022414-4.
Siddik et al., Memory Cells, Methods of Fabrication, and Semiconductor Devices, U.S. Appl. No. 14/193,979, filed Feb. 28, 2014.
Siddik et al., Memory Cells, Methods of Fabrication, and Semiconductor Devices, U.S. Appl. No. 14/030,763, filed Sep. 18, 2013.
Stone et al, Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Vitos et al., The Surface Energy of Metals, Surface Science, vol. 411, (1998), pp. 186-202.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.

(56) References Cited

OTHER PUBLICATIONS

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

Rodmacq et al., Influence of Thermal Annealing on the Perpendicuular Magnetic Anisotropy of Pt/Co/AlOx Trilayers, Physical Review B, vol. 79, (2009), pp. 024423-1-024423-8.

Tsunekawa et al., Effect of Capping Layer Material on Tunnel Magnetoresistance in CoFeb—MgO—CoFeB Magentic Tunnel Junctions, Digests of the IEEE International Magnetics Conference (Apr. 2005), pp. 1983-1984.

S. Pinitsoontom et al., "Three-dimensional atom probe investigation of boron distribution in CofeB/MgO/CoFeB agnetic tunnel junctions" Applied Physics Letters, vol. 93, American Institute of Physics, 2008, pp. 071901-1 to 071901-3.

Taiwanese Office Action and Search Report for Application No. 105100413 dated Oct. 7, 2016, 7 pages.

International Written Opinion for International Application No. PCT/US2015/066828 dated Apr. 11, 2016.

Lee et al., Improved Magnetic Tunnel Junction With Amorphous Seed Layer, Surface Treatment, and High-Polarization Magnetic Materials, Jul. 2004, IEEE, IEEE Transactions on Magnetics, vol. 40, No. 4, all pages.

Japanese Notice of Rejection Grounds for Japanese Application No. 2017-531503, dated Dec. 18, 2018, 7 pages.

Isogami et al., "In situ heat treatment of ultrathin MgO layer for giant magnetoresistance ratio with low resistance area product in CoFeB/MgO/CoFeB magnetic tunnel junctions", Applied Physics Letters, vol. 93(19), (2008) pp. 192109-1-192109-3.

Chinese Office Action and Search Report for Chinese Application No. 201580073144.2, dated Oct. 31, 2018, 18 pages.

Korean Notice of Reasons for Rejection from Korean Application No. 10-2017-7022674, dated Dec. 20, 2018, 5 pages.

European Partial Search Report from European Application No. 15878288.8, dated Aug. 14, 2018, 11 pages.

Extended European Search Report and Written Opinion for European Application No. 15878288.8, dated Jan. 7, 2019, 11 pages.

Notice of Reasons for Rejection for Korean Application No. 10-2017-7022674, dated Jun. 8, 2018, 13 pages with English translation.

* cited by examiner

METHODS OF FORMING SEMICONDUCTOR DEVICES INCLUDING TUNNEL BARRIER MATERIALS

TECHNICAL FIELD

Embodiments disclosed herein relate to semiconductor devices including magnetic memory cells having a magnetic tunnel junction and methods of forming such devices and magnetic tunnel junctions. More specifically, embodiments disclosed herein relate to magnetic tunnel junctions exhibiting a low resistance area product at a high tunnel magnetoresistance, semiconductor devices including the magnetic tunnel junctions, and methods of forming the magnetic tunnel junctions and semiconductor devices.

BACKGROUND

Magnetic Random Access Memory (MRAM) is a nonvolatile memory technology based on magnetoresistance. One type of MRAM is spin torque transfer MRAM (STT-MRAM), in which a magnetic cell core includes a magnetic tunnel junction ("MTJ") sub-structure with at least two magnetic regions, for example, a "fixed region" and a "free region," with a non-magnetic region (e.g., a tunnel barrier material) between. The free region and the fixed region may exhibit magnetic orientations that are either horizontally oriented ("in-plane") or perpendicularly oriented ("out-of-plane") relative to the thickness of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region), defining a "0" logic state of the MRAM cell. In the anti-parallel configuration, the STT-MRAM cell exhibits a higher electrical resistance across the magnetoresistive elements, defining a "1" logic state of the STT-MRAM cell.

Switching of the magnetic orientation of the free region may be accomplished by passing a programming current through the magnetic cell core, including the fixed and free regions. The fixed region polarizes the electron spin of the programming current, and torque is created as the spin-polarized current passes through the core. The spin-polarized electron current exerts the torque on the free region. When the torque of the spin-polarized electron current is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

Switching of the magnetic orientation of the free region of a magnetic memory cell including a MTJ may be affected by the tunnel magnetoresistance ("TMR") and the resistance area product ("RA") of the cell. The TMR of a MTJ is a function of the resistance between a top electrode and a bottom electrode, between which the MTJ is disposed, in the high electrical resistance state and the low electrical resistance state. Specifically, the TMR measures the difference between a cell's electrical resistance in the anti-parallel configuration ($R_{ap}$) and its electrical resistance in the parallel configuration ($R_p$) to $R_p$ (i.e., $TMR=(R_{ap}-R_p)/R_p$). Thus, the TMR is equivalent to the change in resistance observed by changing the magnetic state of the free layer. Generally, a MTJ with a homogeneous crystal structure (e.g., a bcc (001) crystal structure), having few structural defects in the microstructure of its magnetic material, has a higher TMR than a MTJ with structural defects. A cell with high TMR may have a high read-out signal, which may speed the reading of the MRAM cell during operation. A higher TMR is preferred for reliable read operation as it will generate a larger signal difference between the on and off states of the cell. In other words, the higher the TMR, the more sensitive the device, and the easier to distinguish logic states of an associated memory cell.

Another significant characteristic of a magnetic memory cell core includes the RA. The RA of a magnetic memory cell is an indication of the voltage used to switch the magnetic orientation of the free region during programming (e.g., the threshold switching voltage). An increase in the RA of a magnetic memory cell may degrade the performance of the cell by utilizing a higher threshold switching voltage, reducing the usable life of the cell. The RA may be decreased by decreasing a thickness of the tunnel barrier material. However, decreasing the thickness of the tunnel barrier material may also decrease the TMR. Thus, although a high TMR and a low RA are desired, in general, an increase in the TMR of a MTJ is obtained at the expense of a higher RA. A conventional MTJ exhibits a TMR of less than about 120% at an RA of greater than about 4 ohm $\mu m^2$.

Efforts to increase the TMR of a MTJ while maintaining a low RA include attempts to reduce structural defects in the crystal structure of the MTJ. For example, a magnesium oxide tunnel barrier material may be formed at elevated temperatures to produce the tunnel barrier material having stoichiometric proportions and minimal oxygen vacancies or interstitial oxygen. However, the elevated temperatures may undesirably cause an underlying magnetic material to crystallize in an undesired crystal orientation. A mismatch in crystal orientation of the magnetic material and the tunnel barrier material undesirably increases the RA and decreases the TMR of the MTJ. The increase in the RA increases the voltage required to switch the magnetic orientation of the free region during programming, increases the junction resistance, and increases the threshold switching voltage of the device. A decrease in the TMR reduces the effective spin-polarization of the electrons as they pass through the MTJ, reducing tunneling through the MTJ.

Alternatively, the tunnel barrier material may be formed at lower temperatures. However, when the tunnel barrier material is formed at lower temperatures, defects, such as oxygen vacancies and interstitial oxygen atoms, within the tunnel barrier material increase. The atomic defects in the tunnel barrier material may degrade device performance by causing electrons to scatter as they travel through the MTJ and reducing the TMR of the MTJ.

DETAILED DESCRIPTION

Figure 1:
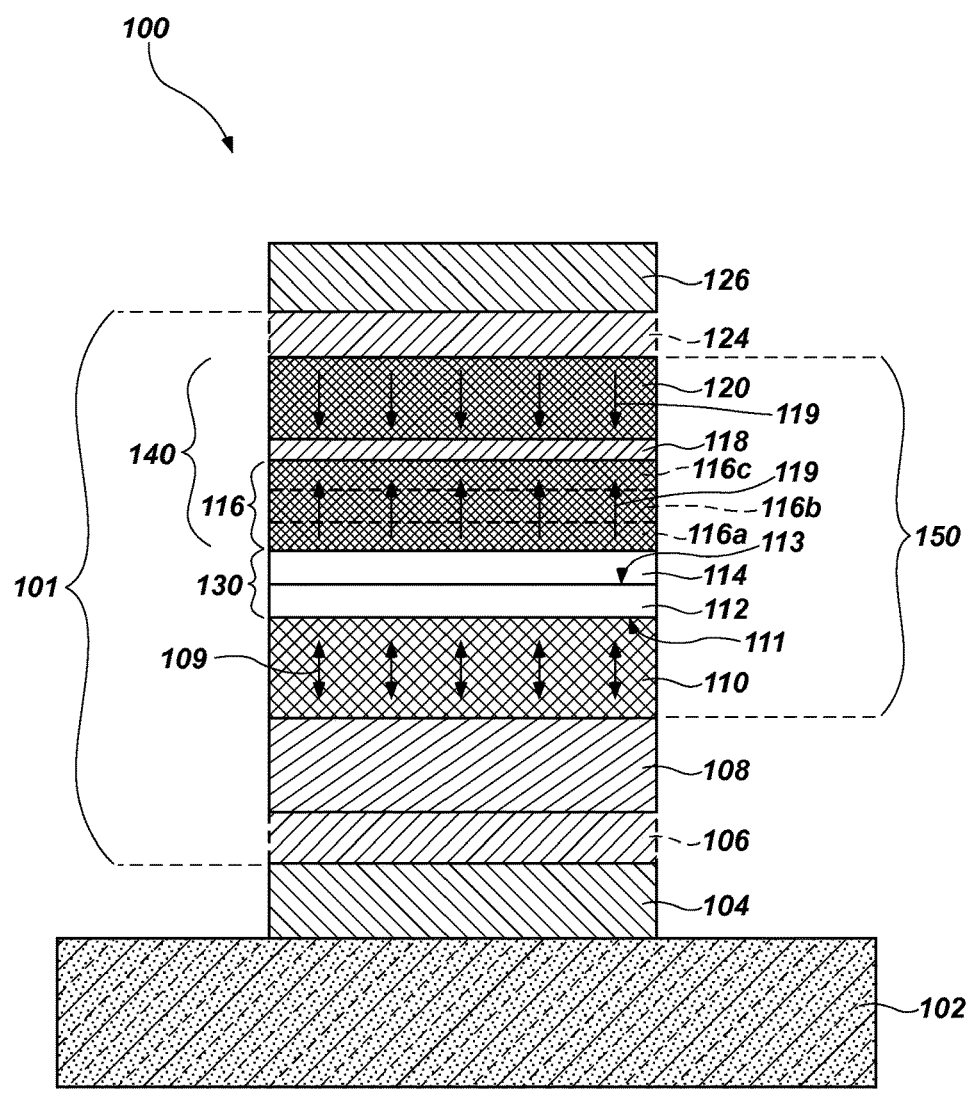
FIG. 1 is a simplified cross-sectional view of a magnetic cell structure according to an embodiment of the disclosure.

The illustrations included herewith are not meant to be actual views of any particular systems or semiconductor structures, but are merely idealized representations that are employed to describe embodiments described herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not describe a complete process flow for manufacturing semiconductor devices, magnetic tunnel junctions, or magnetic memory cells, and the semiconductor devices, magnetic tunnel junctions, and magnetic memory cells described below do not form a complete semiconductor device, magnetic tunnel junction, or magnetic memory cell. Only those process acts and structures necessary to understand the embodiments described herein are described in detail below. Additional acts to form a complete semiconductor device and a magnetic memory cell including the semiconductor device may be performed by conventional techniques.

According to some embodiments, a semiconductor device may include a magnetic cell structure comprising a MTJ. The MTJ may include a tunnel barrier material disposed between adjacent magnetic materials. A magnetic material may overlie a substrate and the tunnel barrier material may overlie the magnetic material. Another magnetic material may overlie the tunnel barrier material. The tunnel barrier material may exhibit the same crystal orientation as the adjacent magnetic materials. The semiconductor device including the MTJ may exhibit a high TMR, such as greater than about 180%, at a low RA, such as at less than about 8 ohm $\mu m^2$.

The tunnel barrier material according to embodiments of the disclosure may include at least two portions. A first portion of the tunnel barrier material may be formed over the magnetic material at a first temperature. The first portion of the tunnel barrier material and the magnetic material may be annealed to crystallize the magnetic material and orient the crystal structure of the magnetic material in alignment with the crystal structure of the first portion of the tunnel barrier material. The magnetic material and the first portion of the tunnel barrier material may be annealed at a temperature between about 300° C. and about 600° C. for an amount of time sufficient to crystallize the magnetic material. After annealing, a second portion of the tunnel barrier material may be formed over the first portion at a second temperature, which is higher than the first temperature at which the first portion of the tunnel barrier material is formed. The tunnel barrier material including the first portion and the second portion may exhibit a higher TMR, such as greater than about 180%, at a low RA, such as at less than about 8 ohm $\mu m^2$, than a conventional tunnel barrier material. The tunnel barrier material may also be thicker and exhibit the higher TMR than a conventional tunnel barrier material, while maintaining the low RA. In some embodiments, the RA of the tunnel barrier material is between about 4 ohm $\mu m^2$ and about 8 ohm $\mu m^2$ and the TMR of the tunnel barrier material is between about 180% and about 205%.

Referring to FIG. 1, a magnetic memory cell 100 including a magnetic cell core 101 according to some embodiments is illustrated. The magnetic cell core 101 may include a magnetic tunnel junction 150 and may be disposed between a lower electrode 104 and an upper electrode 126 over a substrate 102. The MTJ 150 may include a magnetic region and another magnetic region, for example, a "free region 110" and a "fixed region" 140, respectively. A tunnel barrier material 130 may be disposed between the free region 110 and the fixed region 140.

The substrate 102 may include a base material or other construction upon which components, such as those within memory cells, are formed. The substrate 102 may be a semiconductor substrate, a base semiconductor material on a supporting substrate, a metal electrode, or a semiconductor substrate having one or more materials, structures, or regions formed thereon. The substrate 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

The lower electrode 104 may overlie the substrate 102. The lower electrode 104 may include a metal such as copper, tungsten, platinum, palladium, titanium, tantalum, nickel, titanium nitride (TiN), tantalum nitride (TaN), tungsten nitride (WN), polysilicon, a metal silicide, a metal alloy, or combinations thereof.

One or more lower intermediary regions 106 may, optionally, be disposed under the magnetic regions (e.g., the free region 110 and the fixed region 140). The lower intermediary region 106, if included, may be configured to inhibit diffusion of species between the lower electrode 104 and materials overlying the lower electrode 104. The lower intermediary region 106 may include a conductive material such as one or more of copper, tantalum, titanium, tungsten, ruthenium, tantalum nitride, and titanium nitride.

A seed material 108 may overlie the lower intermediary region 106, if present, or the lower electrode 104 if the lower intermediary region 106 is not present. The seed material 108 may include tantalum, platinum, ruthenium, iron, nickel, cobalt, chromium, titanium, zirconium, vanadium, copper, zinc, rhodium, silver, hafnium, tungsten, iridium, tantalum nitride, and combinations thereof. By way of non-limiting example, the seed material 108 may include tungsten and at least one of iron, cobalt, nickel, or another suitable material. In other embodiments, the seed material 108 may include iron and cobalt and may further include at least one transition element, such as tantalum, platinum, ruthenium, nickel, chromium, titanium, zirconium, vanadium, copper, zinc, rhodium, silver, hafnium, and tungsten. In yet other embodiments, the seed material 108 may include at least one of hafnium, zirconium, and tantalum and at least one of iron, cobalt, and nickel, such as FeHf. The seed material 108 may be a homogeneous composition of the seed material 108 or may include distinct portions of one or more of tantalum, platinum, ruthenium, iron, nickel, cobalt, chromium, titanium, zirconium, vanadium, copper, zinc, rhodium, silver, hafnium, tungsten, and iridium adjacent to a distinct portion of another of tantalum, platinum, ruthenium, iron, nickel, cobalt, chromium, titanium, zirconium, vanadium, copper, zinc, rhodium, silver, hafnium, tungsten, and iridium.

The free region 110 may overlie the seed material 108. In some embodiments, the free region 110 directly overlies and contacts the seed material 108. The free region 110 may include a magnetic material exhibiting a switchable magnetic orientation, indicated by arrows 109, during use and operation of the magnetic memory cell 100. The switchable magnetic orientation may be switched between a parallel configuration and an anti-parallel configuration by the application of a current or applied field to the magnetic memory cell 100.

In some embodiments, the free region 110 may be a conventional free region. In other embodiments, the free region 110 may include alternating portions of a magnetic material and a conductive material. However, the free region 110 is not so limited and may include other suitable magnetic materials that exhibit a switchable magnetic orientation.

In some embodiments, the free region 110 may include a ferromagnetic material including at least one of cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the free region 110 may include at least one of Co, Fe, and B (e.g., a CoFeB material, a CoFe material, a FeB material, a CoB material, etc.). As used herein, the term "CoFeB material" means and includes a material comprising cobalt, iron, and boron (e.g., $Co_xFe_yB_z$, wherein x=10 to 80, y=10 to 80, and z=0 to 50). A CoFeB material may or may not exhibit magnetism, depending on its configuration (e.g., its thickness). In other embodiments, the free region 110 may alternatively or additionally include nickel (Ni) (e.g., an NiB material). In some embodiments, the free region 110 may be substantially free of boron and may include, for example, CoFe. The CoFe may be formed as CoFeB and the boron may be diffused out of the free region 110 after formation thereof, or the CoFe may be formed (e.g., deposited) as CoFe, without any boron.

The free region 110 may be homogeneous, or may include one or more sub-regions (e.g., a CoFeB material, with sub-regions having different relative atomic ratios of Co, Fe, and B).

A tunnel barrier material 130 may overlie the free region 110. In some embodiments, the tunnel barrier material 130 directly overlies and contacts the free region 110. The tunnel barrier material 130 may include a nonmagnetic, crystalline material, such as magnesium oxide (MgO), aluminum oxide ($Al_2O_3$), titanium dioxide ($TiO_2$), tantalum oxide ($Ta_2O_5$), ruthenium oxide ($RuO_2$), boron oxide ($B_2O_3$), or combinations thereof. The tunnel barrier material 130 may be configured to induce interfacial magnetic anisotropy in the free region 110 and the fixed region 140 and may also be configured to function as a tunnel region of the MTJ 150 effected by interaction of the free region 110, the tunnel barrier material 130, and the fixed region 140.

The tunnel barrier material 130 may include a first portion 112 and a second portion 114. The first portion 112 may overlie the free region 110. In some embodiments, the first portion 112 directly overlies and contacts the free region 110. The first portion 112 may be formed over the free region 110 to form an interface 111 between the free region 110 and the tunnel barrier material 130. A crystal orientation of the MTJ 150 may not change at the interface 111 between the first portion 112 and the free region 110. By way of example and not limitation, each of the free region 110 and the first portion 112 may exhibit a bcc (001) crystal structure. As described in more detail below, each of the first portion 112 and the free region 110 may be amorphous (e.g., not crystalline) as formed, with the desired crystal structure occurring following an anneal. In some embodiments, the first portion 112 is an oxide material and may include MgO, $Al_2O_3$, $TiO_2$, $Ta_2O_5$, $RuO_2$, $B_2O_3$, or combinations thereof.

The second portion 114 may overlie the first portion 112. In some embodiments, the second portion 114 directly overlies and contacts the first portion 112. An interface 113 between the first portion 112 and the second portion 114 may be smooth and exhibit the same crystal orientation as the first portion 112 and the free region 110 (e.g., a bcc (001) crystal structure). The second portion 114 may be an oxide material and may include MgO, $Al_2O_3$, $TiO_2$, $Ta_2O_5$, $RuO_2$, $B_2O_3$, or combinations thereof. The first portion 112 and the second portion 114 may include the same material. In some embodiments, the first portion 112 and the second portion 114 include MgO. In some such embodiments, the second portion 114 includes a ratio of oxygen to magnesium closer to stoichiometric (e.g., 1:1) than the first portion 112. Thus, the second portion 114 may have less oxygen vacancies and less interstitial oxygen and also a higher density than the first portion 112. The second portion 114 may exhibit less structural defects than the first portion 112 and, in some embodiments, may exhibit a higher TMR and a lower RA than the first portion 112.

The tunnel barrier material 130 may have a total thickness (i.e., a sum of a thickness of the first portion 112 and a thickness of the second portion 114) of between about 10 Å and about 30 Å, such as between about 10 Å and about 15 Å, between about 15 Å and about 20 Å, between about 20 Å and about 25 Å, or between about 25 Å and about 30 Å. The tunnel barrier material 130 may have a thickness of between about 10 Å and about 20 Å. In some embodiments, the thickness of the tunnel barrier material 130 is about 18 Å.

The first portion 112 and the second portion 114 may have the same thickness, the first portion 112 may have a greater thickness than the second portion 114, or the second portion 114 may have a greater thickness than the first portion 112. The RA and the TMR of the MTJ 150 may be tailored by altering the thickness of the first portion 112 relative to the thickness of the second portion 114 of the tunnel barrier material 130. A ratio of the thickness of the first portion 112 to the thickness of the second portion 114 may be between about 0.9 and about 2.0, such as between about 0.9 and about 1.0, between about 1.0 and about 1.25, between about 1.25 and about 1.5, between about 1.2 and about 1.8, or between about 1.5 and about 2.0. In some embodiments, the ratio is between about 1.0 and about 1.5 and the total thickness of the tunnel barrier material 130 is about 18 Å.

The tunnel barrier material 130 having the first portion 112 and the second portion 114 may exhibit a TMR of between about 180% and about 600%, such as between about 180% and about 200%, between about 180% and about 225%, between about 180% and about 300%, between about 200% and about 220%, between about 220% and about 250%, between about 250% and about 300%, between about 300% and about 400%, or between about 400% and about 600%. In some embodiments, the TMR is between about 180% and about 300%. The tunnel barrier material 130 may exhibit a RA of between about 3 ohm $\mu m^2$ and about 8 ohm $\mu m^2$, such as between about 3 ohm $\mu m^2$ and about 4 ohm $\mu m^2$, between about 4 ohm $\mu m^2$ and about 5 ohm $\mu m^2$, between about 5 ohm $\mu m^2$ and about 6 ohm $\mu m^2$, between about 6 ohm $\mu m^2$ and about 7 ohm $\mu m^2$, or between about 7 ohm $\mu m^2$ and about 8 ohm $\mu m^2$. In some embodiments, the RA is between about 6 ohm $\mu m^2$ and about 7 ohm $\mu m^2$. In other embodiments, the tunnel barrier material 130 exhibits an RA of between about 4 ohm $\mu m^2$ and about 8 ohm $\mu m^2$ and a TMR of between about 180% and about 205%. By way of non-limiting example, the tunnel barrier material 130 may exhibit a RA of about 4 ohm $\mu m^2$ and a TMR of about 180%, or a RA of about 8 ohm $\mu m^2$ and a TMR of about 205% at a thickness of between about 10 Å and about 20 Å.

The fixed region 140 may overlie the tunnel barrier material 130. In some embodiments, the fixed region 140 directly overlies and contacts the second portion 114 of the tunnel barrier material 130.

The fixed region 140 may include one or more magnetic materials and, optionally, one or more non-magnetic materials. For example, the fixed region 140 may be configured as a synthetic antiferromagnet including a sub-region of ruthenium or tantalum adjoined by magnetic sub-regions. The magnetic sub-regions may include a material including cobalt, and at least one of palladium and platinum, and combinations thereof, a CoFeB material, and combinations thereof. Alternatively, the fixed region 140 may be configured with structures of alternating sub-regions of magnetic material and coupler material. Each of the magnetic sub-regions may include one or more materials and one or more regions therein. As another example, the fixed region 140 may be configured as a single, homogeneous magnetic material. Accordingly, the fixed region 140 may have uniform magnetization, or sub-regions of differing magnetization that, overall, effect the fixed region 140 having a fixed magnetic orientation during use and operation of the magnetic memory cell 100.

The fixed region 140 may include a first magnetic portion 116 over the second portion 114 of the tunnel barrier material 130, a coupling material 118 over the first magnetic portion 116, and a second magnetic portion 120 over the coupling material 118. In some embodiments, the first magnetic portion 116 includes a first magnetic sub-region 116a that may include a CoFeB material overlying the second portion 114, a spacer 116b that may include a tantalum material overlying the first magnetic portion 116, and a second magnetic sub-region 116c that may include a material including cobalt and at least one of palladium and platinum (e.g., CoPd, CoPt) over the spacer 116b. The coupling material 118 may include a ruthenium material overlying the second magnetic sub-region 116c of the first magnetic portion 116. The second magnetic portion 120 may include a material including cobalt, palladium, platinum, and combinations thereof, such as cobalt and at least one of palladium and platinum. In some embodiments, the second magnetic portion 120 includes the same material as the second magnetic sub-region 116c of the first magnetic portion 116.

Figure 2:
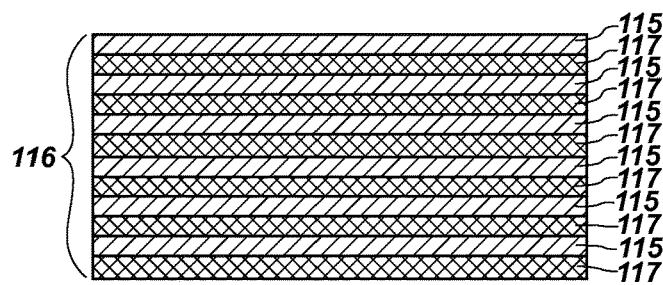
FIG. 2 is a simplified cross-sectional view of a magnetic material including alternating portions of a magnetic material and a conductive material.

In other embodiments, the first magnetic portion 116 includes an artificial superlattice structure and the second magnetic portion 120 includes another artificial superlattice structure overlying the coupling material 118. Referring to FIG. 2, the artificial superlattice structure of the first magnetic portion 116 may include alternating portions of a magnetic material 117 and a conductive material 115. The conductive material 115 may enable the magnetic material 117 to exhibit a perpendicular anisotropy (i.e., a vertical magnetic orientation). The magnetic material 117 may include cobalt, iron, and combinations thereof. The conductive material 115 may include at least one of platinum, palladium, nickel, and iridium. In some embodiments, the magnetic material 117 includes cobalt and the conductive material 115 includes platinum. Although FIG. 2 depicts six regions of magnetic material 117 and six regions of conductive material 115 in the first magnetic portion 116, the artificial superlattice structure of the first magnetic portion 116 is not so limited and may include any number (e.g., one, two, three, four, five, etc.) of alternating regions of magnetic material 117 and conductive material 115.

In some embodiments, a region of the conductive material 115 of the first magnetic portion 116 may directly overlie and contact the second portion 114 of the tunnel barrier material 130. For example, a region of the conductive material 115 may directly overlie and contact the second portion 114 of the tunnel barrier material 130. In other embodiments, a region of the magnetic material 117 may directly overlie and contact the second portion 114 of the tunnel barrier material 130.

Referring back to FIG. 1, the coupling material 118 may overlie the first magnetic portion 116. In some embodiments, the coupling material 118 directly overlies and contacts the first magnetic portion 116 (e.g., the second magnetic sub-region 116c of the first magnetic portion 116). The coupling material 118 may include tantalum, ruthenium, rhodium, and combinations thereof. In some embodiments, the coupling material 118 is ruthenium. The coupling material 118 may have a thickness between about 1 Å and about 10 Å. In some embodiments, the coupling material 118 has a thickness between about 4 Å and about 5 Å.

The second magnetic portion 120 may directly overlie the coupling material 118. The second magnetic portion 120 may include the same materials and may be substantially the same as at least a portion of the first magnetic portion 116. In some embodiments, the second magnetic portion 120 includes a material including cobalt and at least one of palladium and platinum and may include the same material as the second magnetic sub-region 116*c* of the first magnetic portion 116.

The first magnetic portion 116 and the second magnetic portion 120 of the fixed region 140 may include a fixed magnetic orientation, indicated by arrows 119. The fixed magnetic orientation may be north, south, east, west, etc. The fixed magnetic orientation of the first magnetic portion 116 and the second magnetic portion 120 may be the same or may be different.

One or more upper intermediary regions 124 may, optionally, be disposed over the fixed region 140. The upper intermediary region 124, if included, may be configured to inhibit diffusion of species between the upper electrode 126 and underlying materials during operation of the memory cell. The upper intermediary region 124 may include a conductive material (e.g., one or more materials such as copper, tantalum, titanium, tungsten, ruthenium, tantalum nitride, titanium nitride) that may form a conductive capping region.

The upper electrode 126 may overlie the upper intermediary region 124. The upper electrode 126 may include copper, tungsten, platinum, palladium, titanium, tantalum, nickel, titanium nitride, tantalum nitride, tungsten nitride, polysilicon, a metal silicide, a metal alloy, or combinations thereof. In some embodiments, the upper electrode 126 includes the same materials as the lower electrode 104.

The magnetic memory cell 100 of FIG. 1 is configured as a "top pinned" memory cell (i.e., a memory cell in which the fixed region 140 is disposed over the free region 110). However, in other embodiments, such as that of FIG. 3, a free region 110' may overlie a fixed region 140'. Thus, with reference to FIG. 3, a magnetic memory cell 100' including a MTJ 150' may be configured as a "bottom pinned" memory cell. The magnetic memory cell 100' may include a magnetic cell core 101' disposed between the lower electrode 104 and the upper electrode 126.

The magnetic memory cell 100' may include a lower intermediary region 106 overlying the lower electrode 104. The seed material 108 may overlie the lower intermediary region 106, if present. In other embodiments, the seed material 108 may directly overlie and contact the lower electrode 104. The seed material 108 may be the same as described above with reference to FIG. 1.

The fixed region 140' may directly overlie and contact the seed material 108. The fixed region 140' may include a fixed magnetic orientation, indicated by arrows 119. The fixed region 140' may include the same materials described above with reference to fixed region 140. In some embodiments, the fixed region 140' includes a second magnetic portion 120', a coupling material 118', and a first magnetic portion 116'. The first magnetic portion 116' may include a first magnetic sub-region 116*a*', a spacer 116*b*', and a second magnetic sub-region 116*c*'. The first magnetic sub-region 116*a*', the spacer 116*b*', and the second magnetic sub-region 116*c*' may be the same as the first magnetic sub-region 116*a*, the spacer 116*b*, and the second magnetic sub-region 116*c*, respectively, described above with reference to FIG. 1. Each of the first magnetic portion 116', the coupling material 118', and the second magnetic portion 120' may be the same as the first magnetic portion 116, the coupling material 118, and the second magnetic portion 120, respectively, described above with reference to FIG. 1. However, the fixed region 140' may not directly overlie the tunnel barrier material 130 as in the magnetic memory cell 100 of FIG. 1. Rather, the second magnetic portion 120' of the fixed region 140' may directly overlie and contact the underlying seed material 108. The coupling material 118' may overlie the second magnetic portion 120' and the first magnetic portion 116' may overlie the coupling material 118'.

The tunnel barrier material 130 may overlie the fixed region 140'. The first portion 112 of the tunnel barrier material 130 may directly overlie and contact the fixed region 140'. The first portion 112 may be formed over the fixed region 140' to form an interface 111' between the fixed region 140' and the tunnel barrier material 130. The fixed region 140' may exhibit a crystal structure that is aligned with a crystal structure of the first portion 112. By way of example and not limitation, each of the first portion 112 and the fixed region 140' may exhibit a bcc (001) crystal structure without a change in the crystal structure of the MTJ 150' at the interface 111'.

The tunnel barrier material 130 may include the same materials as described above with reference to FIG. 1. Thus, each of the first portion 112 and the second portion 114 of the tunnel barrier material 130 may be the same as described above with reference to FIG. 1. An interface 113' between the first portion 112 and the second portion 114 may be smooth and exhibit the same crystal orientation as the interface 111' on which the first portion 112 is formed. The tunnel barrier material 130 may be disposed directly between the fixed region 140' and the free region 110'.

The free region 110' may directly overlie and contact the tunnel barrier material 130. In some embodiments, the free region 110' directly overlies and contacts the second portion 114 of the tunnel barrier material 130. The free region 110' may include the same materials as described above with reference to FIG. 1. The free region 110' may include a switchable magnetic orientation, indicated by arrows 109.

The optional upper intermediary region 124 may overlie the free region 110'. The upper electrode 126 may overlie the upper intermediary region 124, if present.

Figure 3:
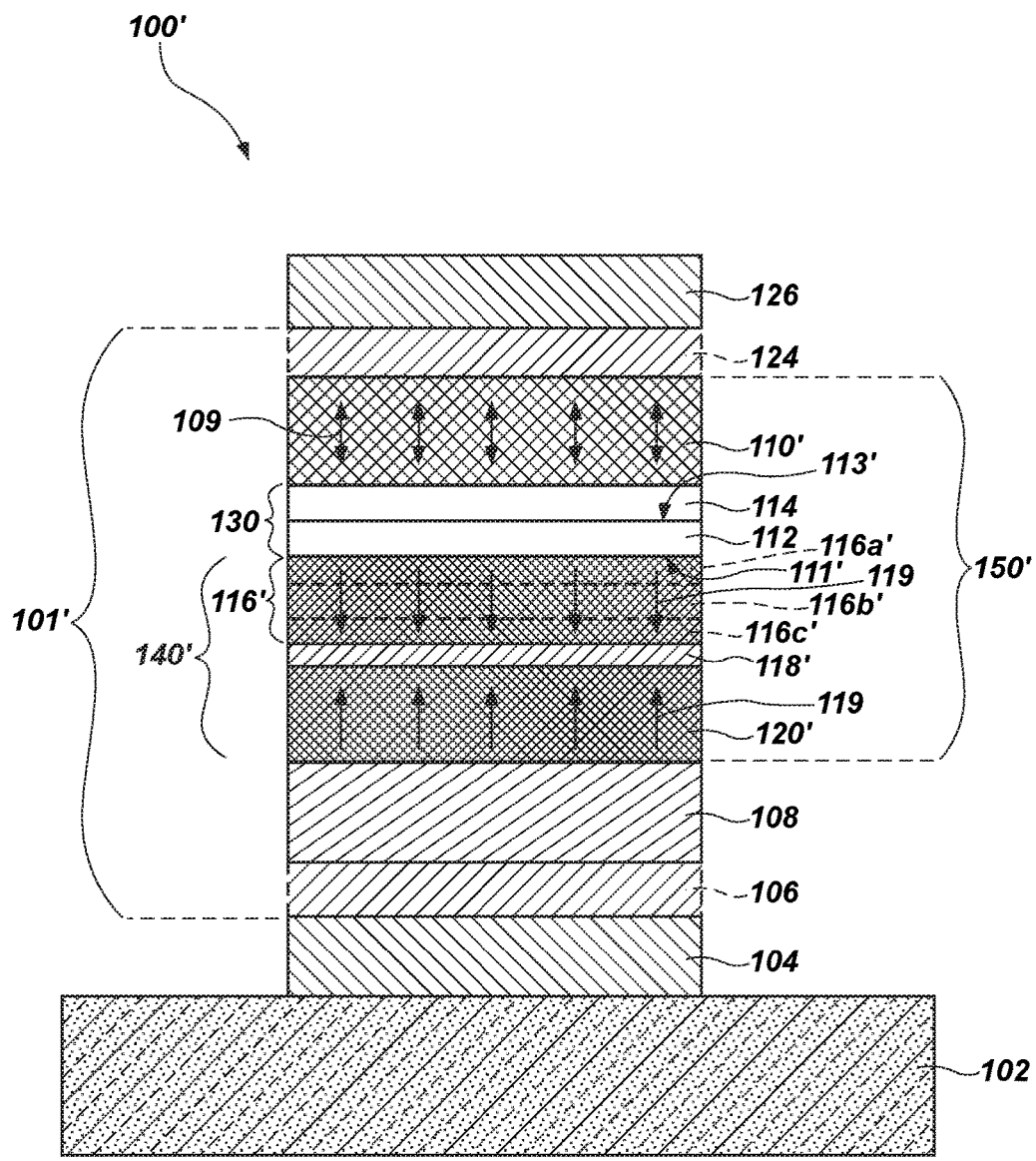
FIG. 3 is a simplified cross-sectional view of a magnetic cell structure according to another embodiment of the disclosure.
Figure 4:
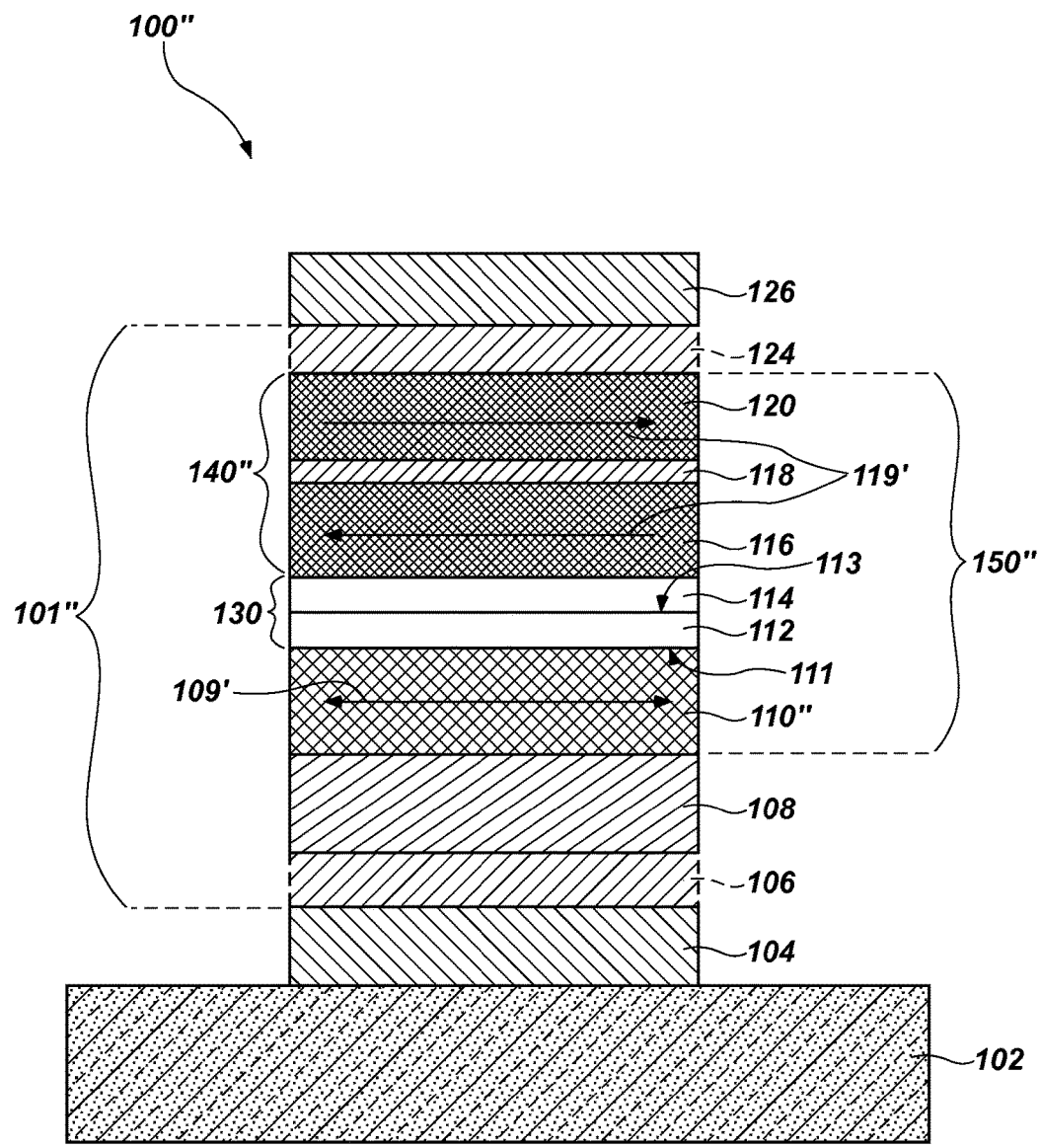
FIG. 4 is a simplified cross-sectional view of a magnetic cell structure according to an embodiment of the present disclosure, wherein the fixed region and the free region exhibit in-plane magnetic orientations.

The memory cells of embodiments of the disclosure may be configured as "out-of-plane" STT-MRAM cells. "Out-of-plane" STT-MRAM cells may include magnetic regions exhibiting a magnetic orientation that is predominately oriented in a vertical direction (e.g., a direction that is perpendicular to a width and length of the respective region or a direction that is perpendicular to a primary surface of the substrate on which the STT-MRAM cell is located). For example, as illustrated in FIG. 1 and FIG. 3, an STT-MRAM cell (e.g., magnetic memory cell 100, magnetic memory cell 100') may be configured to exhibit a vertical magnetic orientation in at least one of the magnetic regions (e.g., the free region 110, 110' and the fixed region 140, 140'). As indicated in FIG. 1 and FIG. 3, each of the free region 110, 110' and the fixed region 140, 140' may exhibit a vertical magnetic orientation as indicated by the arrows 109 and the arrows 119. The magnetic orientation of the fixed region 140, 140' may remain directed in essentially the same direction throughout use and operation of the STT-MRAM cell, for example, in the direction indicated by arrows 119. The magnetic orientation of the free region 110, 110', on the other hand, may be switched during use and operation of the cell, between a parallel configuration and an anti-parallel configuration, as indicated by the arrows 109. As another example, as illustrated in FIG. 4, an in-plane magnetic memory cell 100″ including a magnetic cell core 101″ may be configured to exhibit a horizontal magnetic orientation in at least one of the magnetic regions (e.g., a free region 110″ and a fixed region 140″) of an MTJ 150″, as indicated by arrow 109′ in the free region 110″ and arrow 119′ in the fixed region 140″.

A semiconductor device may include at least one magnetic memory cell including the magnetic cell cores 101, 101′, 101″ of the disclosure disposed between a pair of electrodes.

Accordingly, a semiconductor device is disclosed. The semiconductor device comprises a magnetic tunnel junction over a seed material on a substrate, the magnetic tunnel junction exhibiting a tunnel magnetoresistance of between about 180% and about 300% and comprising a magnetic material over the seed material, an oxide material over the magnetic material, another oxide material over the oxide material, the oxide material and the another oxide material having a thickness of between about 10 Å and about 20 Å, and another magnetic material over the another oxide material.

Figure 5A:
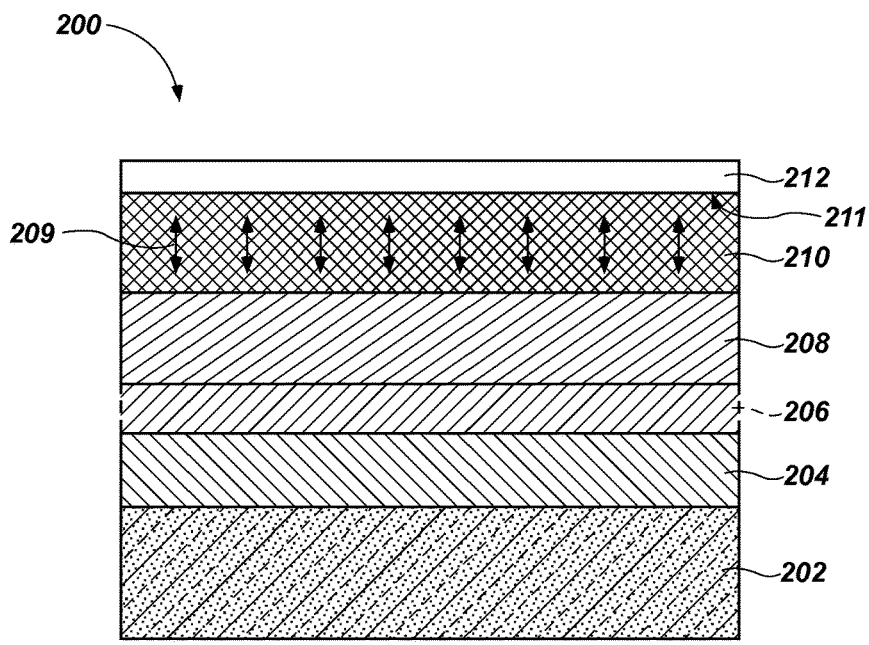
FIG. 5A through FIG. 5C are simplified cross-sectional views illustrating different process stages for an embodiment of a method for forming the magnetic cell structure of FIG. 1.
Figure 5B:
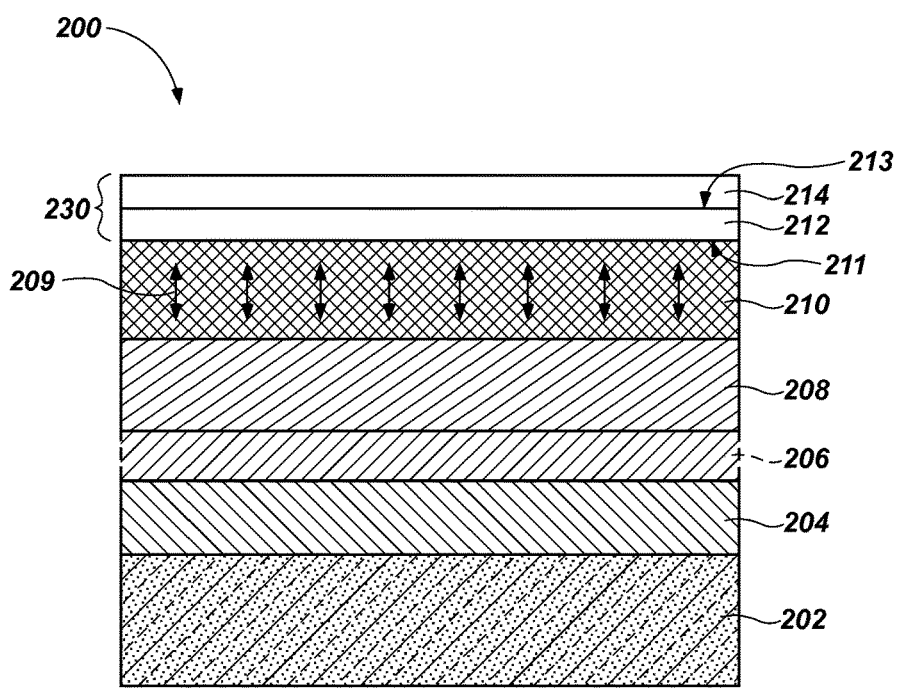
Figure 5C:
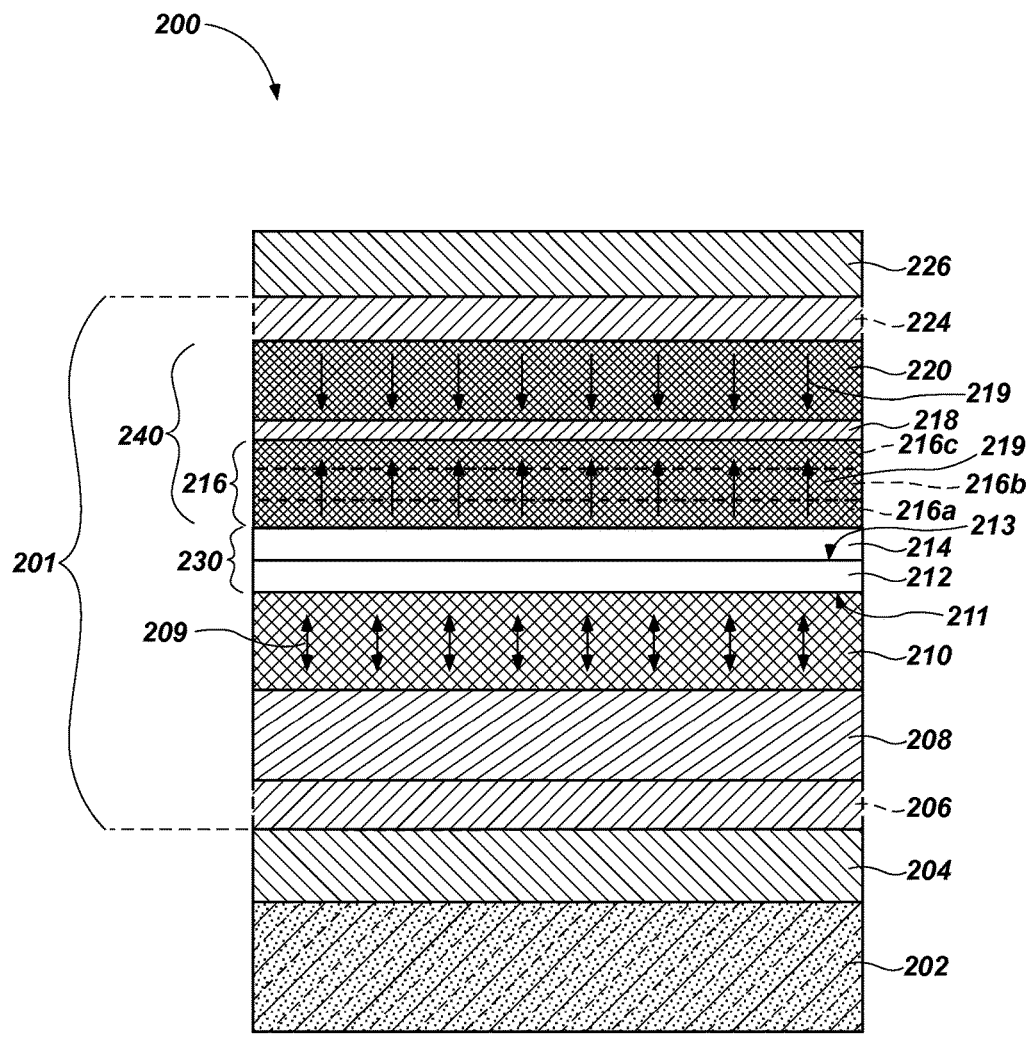

Referring to FIG. 5A through FIG. 5C, a method of forming the magnetic memory cell 100 of FIG. 1 is shown. The method may include forming a magnetic memory cell 200 over a substrate 202. A lower electrode material 204 may be formed over the substrate 202. The lower electrode material may include any of the materials described above with reference to the lower electrode 104.

An intermediary region material 206 may, optionally, be formed over the lower electrode material 204. The lower intermediary region material 206 may be formed from any of the materials described above with reference to the lower intermediary region 106. In some embodiments, the lower intermediary region material 206 may be integral with the conductive material of the lower electrode material 204. For example, the lower intermediary region material 206 may be an upper-most sub-region of the lower electrode material 204.

A seed material 208 may be formed over the lower intermediary region material 206, if present, or the lower electrode material 204. The seed material 208 may be formed as described above with reference to FIG. 1. Each portion of the seed material 208 may be formed by sputter deposition, such as by magnetron sputtering (e.g., high-power impulse magnetron sputtering (HIPIMS), dc magnetron sputtering, etc.), ion-beam sputtering, or other PVD methods. The seed material 208 may be also formed by at least one of atomic layer deposition (ALD), chemical vapor deposition (CVD), plasma enhanced chemical vapor deposition (PECVD), low pressure chemical vapor deposition (LPCVD), or other film deposition processes.

A free region material 210 may be formed over the seed material 208. The free region material 210 may be formed of any of the materials described above with reference to the free region 110. For example, the free region material 210 may include a CoFeB material. In other embodiments, the free region material 210 may include an artificial superlattice structure material formed of alternating portions of the magnetic material 117 and the conductive material 115, as described above with reference to the first magnetic portion 116 of FIG. 2. The free region material 210 may be amorphous when formed and may be formed at a temperature such that the free region material 210 remains in an amorphous state. The free region material 210 may exhibit a switchable magnetic orientation, indicated by arrows 209.

As shown in FIGS. 5A and 5B, a tunnel barrier material 230 may be formed over the free region material 210. The tunnel barrier material 230 may include a first portion 212 and a second portion 214. The first portion 212 of the tunnel barrier material 230 may be formed over the free region material 210 to form an interface 211. The first portion 212 of the tunnel barrier material 230 may be formed from the same materials as described above with reference to the first portion 112 of the tunnel barrier material 130.

The first portion 212 may be formed by at least one of ALD, CVD, PECVD, LPCVD, PVD, or other film deposition processes. In some embodiments, the first portion 212 is formed by sputter deposition, such as by magnetron sputtering (e.g., high-power impulse magnetron sputtering (HIPIMS), DC sputtering, etc.), RF sputtering, electron beam physical vapor deposition, ion-beam reactive sputtering, or other PVD methods. In some embodiments, the first portion 212 is formed from MgO. The first portion 212 may be formed as MgO, rather than formed as a magnesium portion that is subsequently oxidized to MgO by exposing the magnesium portion to oxidizing conditions. The source of the MgO may be a single crystal MgO or a multi-crystal MgO deposition source or sputtering target.

The first portion 212 may be formed over the free region material 210 at a first temperature such that the underlying free region material 210 is not crystallized. In other words, the free region material 210 may remain amorphous during formation of the first portion 212 of the tunnel barrier material 230. As formed, the first portion 212 may be amorphous or crystalline. In some embodiments, the free region material 210 includes a CoFeB material that remains amorphous during formation of the first portion 212. In some embodiments, the first portion 212 is crystalline when initially formed. The first portion 212 may be formed at a temperature between about −150° C. and about 150° C., such as between about −150° C. and about 0° C., between about 0° C. and about 25° C., between about 20° C. and about 25° C., between about 25° C. and about 50° C., or between about 50° C. and about 150° C. In some embodiments, the first portion 212 is formed at room temperature (e.g., between about 20° C. and about 25° C.). If the first portion 212 is formed at room temperature, the underlying free region material 210 may remain in its amorphous state.

After forming the first portion 212 of the tunnel barrier material 230 over the free region material 210, the free region material 210 and the first portion 212 may be annealed, such as by thermal annealing. Exposing the free region material 210 and the first portion 212 to annealing conditions may crystallize the free region material 210 from the interface 211 through the free region material 210. After annealing the first portion 212 and the free region material 210, the free region material 210 may have a crystal structure that is aligned with (i.e., matched to) a crystal structure of the first portion 212. In some embodiments, a CoFeB free region material 210 is crystallized from the interface 211 and includes the same crystal structure as the first portion 212 including MgO. Annealing the first portion 212 may also cause any oxygen vacancies within the first portion 212 to fill with oxygen, increasing the stoichiometry of the first portion 212 of the tunnel barrier material 230. By way of non-limiting example, where the first portion 212 includes MgO, annealing the first portion 212 may attract oxygen to the first portion 212, filling any oxygen vacancies that may have been formed during the low temperature formation of the first portion 212.

To anneal the free region material 210 and the first portion 212, the free region material 210 and the first portion 212 may be exposed to a temperature sufficient to crystallize the free region material 210 and for a sufficient amount of time. Exposing the first portion 212 to annealing conditions may increase the crystal quality of the first portion 212 upon which the second portion 214 may be subsequently formed, as described in more detail below. The annealing may also form a smooth surface of the first portion 212, upon which the second portion 214 is formed. The free region material 210 and the first portion 212 may be exposed to a temperature of between about 300° C. and about 600° C. for between about 60 seconds and about one hour (1 hr.). The free region material 210 and the first portion 212 may be exposed to a temperature of between about 300° C. and about 350° C., between about 350° C. and about 400° C., between about 400° C. and about 500° C., or between about 500° C. and about 600° C. The exposure time may be between about 60 seconds and about five minutes, between about 5 minutes and 15 minutes, between about 15 minutes and about 30 minutes, or between about 30 minutes and about 60 minutes.

Referring to FIG. 5B, after annealing the free region material 210 and the first portion 212, the second portion 214 of the tunnel barrier material 230 may be formed. The second portion 214 may be formed directly over and in contact with the first portion 212. The second portion may be formed of the same materials described above with reference to the second portion 114. In some embodiments, the second portion 214 is formed of the same material as the first portion 212. The first portion 212 of the tunnel barrier material 230 that has been annealed may act as a seed upon which the second portion 214 is formed, such that the crystal structure of the second portion 214 matches the crystal structure of the first portion 212. An exposed surface of the first portion 212 may be a seed upon which the second portion 214 is formed to the same crystal orientation as the first portion 212 and the free region material 210. The first portion 212 and the second portion 214 may exhibit the same crystal orientation at an interface 213.

The second portion 214 of the tunnel barrier material 230 may be formed at a second temperature that is higher than the first temperature at which the first portion 212 is formed. The second portion 214 may be formed by one of the same methods described above for forming the first portion 212. For example, the second portion 214 may be formed by sputter deposition, such as by at least one of ALD, CVD, PECVD, LPCVD, PVD, or other film deposition processes. In some embodiments, the second portion 214 is formed by sputter deposition, such as by magnetron sputtering (e.g., high-power impulse magnetron sputtering (HIPIMS), DC sputtering, etc.), RF sputtering, electron beam physical vapor deposition, ion-beam reactive sputtering, or other PVD methods. However, the second portion 214 may be formed at a different, higher temperature than the first portion 212 is formed. For example, the second portion 214 may be formed at a temperature between about 300° C. and about 600° C., as described above. The second portion 214 may be formed at the same temperature as the temperature at which the first portion 212 and the free region material 210 are annealed. In other embodiments, the second portion 214 may be formed at a different temperature than the temperature at which the first portion 212 and the free region material 210 are annealed. By way of non-limiting example, the second portion 214 may be formed at a temperature between about 300° C. and about 600° C., such as between about 300° C. and about 350° C., between about 350° C. and about 400° C., between about 400° C. and about 500° C., or between about 500° C. and about 600° C. Forming the second portion 214 at an elevated temperature may form a more stoichiometric material having an increased crystal quality. For example, where the second portion 214 includes MgO, the second portion 214 may include a stoichiometric amount of oxygen with less oxygen vacancies and less interstitial oxygen than the first portion 212. In some embodiments, each of the first portion 212 and the second portion 214 have a ratio of magnesium to oxygen of approximately one to one.

The second portion 214 may be formed to the same thickness, a greater thickness, or a lesser thickness than the first portion 212. In some embodiments, the ratio is about 1.5 and the total thickness of the tunnel barrier material 130 is about 18 Å. The ratio of the thickness of the first portion 212 to the second portion 214 may be tailored to increase the TMR and decrease the RA of the tunnel barrier material 230. The tunnel barrier material 230 may be formed to exhibit a TMR of between about 180% and about 600% and an RA of between about 3 ohm μm$^2$ and about 8 ohm μm$^2$, as described above with reference to the tunnel barrier material 130. In some embodiments, the thickness of the second portion 214 is less than a thickness of the first portion 212.

With reference to FIG. 5C, a fixed region material 240 may be formed over the second portion 214 of the tunnel barrier material 230. The fixed region material 240 may include a first magnetic material 216 over the second portion 214 of the tunnel barrier material 230, a coupling material 218 over the first magnetic material 216, and a second magnetic material 220 over the coupling material 218. The first magnetic material 216 may include a first magnetic sub-region 216a, a spacer material 216b, and a second magnetic sub-region 216c. Each of the first magnetic sub-region 216a, the spacer material 216b, and the second magnetic sub-region 216c may be formed of the same materials as the first magnetic sub-region 116a, the spacer 116b, and the second magnetic sub-region 116c, respectively, described above. Each of the first magnetic material 216, the coupling material 218, and the second magnetic material 220 may be formed of the same materials as the first magnetic portion 116, the coupling material 118, and the second magnetic portion 120, respectively, described above. The first magnetic material 216 and the second magnetic material 220 of the fixed region material 240 may include a fixed magnetic orientation, indicated by arrows 219.

The coupling material 218 may be formed over the first magnetic material 216 (e.g., over the second magnetic sub-region 216c of the first magnetic material 216). The coupling material 218 may be formed between the first magnetic material 216 and the second magnetic material 220. The coupling material 218 may be formed by at least one of ALD, CVD, PVD, PECVD, LPCVD, or other film deposition processes.

The second magnetic material 220 may be formed directly over the coupling material 218. The second magnetic material 220 may be formed in the same manner and from the same materials as the first magnetic material 216.

An upper intermediary region material 224 may optionally be formed over the second magnetic material 220 and may include the same materials as the lower intermediary region material 206. An upper electrode material 226 may be formed over the upper intermediary region material 224, if present, or over the second magnetic material 220. The upper electrode material 226 may be formed of the same materials as described above with reference to the upper electrode 126.

The magnetic memory cell 200 may be processed to form the magnetic memory cell 100 as shown in FIG. 1. The magnetic memory cell 200 structure may be processed by conventional photolithography, material removal, etching, or other processes that are not described in detail herein.

Although the magnetic memory cell 200 described with reference to FIG. 5A through FIG. 5C describes forming the magnetic memory cell 100 of FIG. 1, the magnetic memory cell 100' of FIG. 3 may be formed by similar methods. However, the fixed region material 240 would be formed over the seed material 208, the first portion 212 of the tunnel barrier material 230 would be formed over the fixed region material 240, and the free region material 210 would be formed over the second portion 214 of the tunnel barrier material 230, resulting in the magnetic memory cell of FIG. 3. In other embodiments, the magnetic memory cell 100" of FIG. 4 may be formed by forming the free region material 210 and the fixed region material 240 to exhibit a horizontal magnetic orientation.

Forming the tunnel barrier material 230 from the first portion 212 and the second portion 214 may increase the TMR and decrease the RA of the magnetic tunnel junction. The MTJ 150 may be substantially free of defects such as oxygen vacancies or interstitial oxygen within the crystal structure of the tunnel barrier material 230. The tunnel barrier material 230 may, therefore, exhibit improved tunneling characteristics at a high TMR and a low RA.

Accordingly, a method of forming a semiconductor device is disclosed. The method comprises forming a magnetic material over an electrode on a substrate, forming a first tunnel barrier material over the magnetic material, annealing the magnetic material and the first tunnel barrier material, forming a second tunnel barrier material over the annealed first tunnel barrier material, forming another magnetic material over the second tunnel barrier material, and forming another electrode over the another magnetic material.

Accordingly, a method of forming a magnetic tunnel junction is disclosed. The method comprises forming at a first temperature a barrier material over a magnetic material, annealing the barrier material and the magnetic material, forming at a second temperature another barrier material over the annealed barrier material, and forming another magnetic material over the another barrier material.

Accordingly, a method of forming a semiconductor device is disclosed. The method comprises forming a seed material over a substrate, forming a magnetic material over the seed material, forming at a first temperature an oxide material over the magnetic material, forming at a second temperature higher than the first temperature, another oxide material over the oxide material, and forming another magnetic material over the another oxide material.

Figure 6:
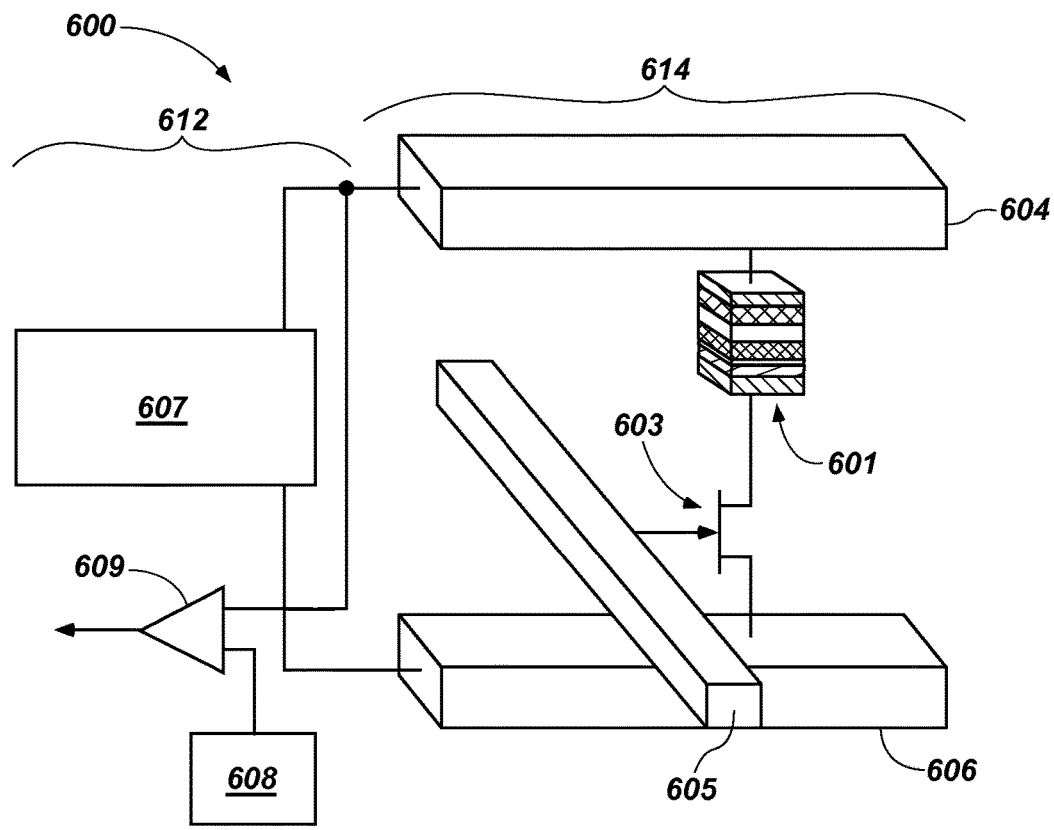
FIG. 6 is a schematic of an STT-MRAM system including a memory cell having a magnetic cell structure according to an embodiment of the disclosure.

With reference to FIG. 6, illustrated is an STT-MRAM system 600 that includes peripheral devices 612 in operable communication with an STT-MRAM cell 614, a grouping of which may be fabricated to form an array of memory cells in a grid pattern including a number of rows and columns, or in various other arrangements, depending on the system requirements and fabrication technology. The STT-MRAM cell 614 may include a magnetic cell core 601, an access transistor 603, a conductive material that may function as a data/sense line 604 (e.g., a bit line), a conductive material that may function as an access line 605 (e.g., a word line) and a conductive material that may function as a source line 606. The peripheral devices 612 of the STT-MRAM system may include read/write circuitry 607, a bit line reference 608, and a sense amplifier 609. The magnetic cell core 601 may be any one of the magnetic cell cores 101, 101', 101" described above. Due to the structure of the magnetic cell core 601, the method of fabrication, or both, the STT-MRAM cell 614 may have a high TMR and a low resistance (e.g., low RA product).

In use and operation, when an STT-MRAM cell 614 is selected to be programmed, a programming current is applied to the STT-MRAM cell 614, and the current is spin-polarized by the fixed region of the magnetic cell core 601 and exerts a torque on the free region of the magnetic cell core 601, which switches the magnetization of the free region to "write to" or "program" the STT-MRAM cell 614. In a read operation of the STT-MRAM cell 614, a current is used to detect the resistance state of the magnetic cell core 601.

To initiate programming of the STT-MRAM cell 614, the read/write circuitry 607 may generate a write current (i.e., a programming current) to the data/sense line 604 and the source line 606. The polarity of the voltage between the data/sense line 604 and the source line 606 determines the switch in magnetic orientation of the free region in the magnetic cell core 601. By changing the magnetic orientation of the free region with the spin polarity, the free region is magnetized according to the spin polarity of the programming current and the programmed logic state is written to the STT-MRAM cell 614.

To read the STT-MRAM cell 614, the read/write circuitry 607 generates a read voltage to the data/sense line 604 and the source line 606 through the magnetic cell core 601 and the access transistor 603. The programmed state of the STT-MRAM cell 614 relates to the electrical resistance across the magnetic cell core 601, which may be determined by the voltage difference between the data/sense line 604 and the source line 606. In some embodiments, the voltage difference may be compared to the bit line reference 608 and amplified by the sense amplifier 609.

FIG. 6 illustrates one example of a STT-MRAM system 600 including at least one magnetic memory cell. It is contemplated, however, that the magnetic cell cores 101, 101', 101" may be incorporated and utilized within any STT-MRAM system configured to incorporate a magnetic cell core having magnetic regions. It is also contemplated that the magnetic cell cores 101, 101', 101" may be used in other magnetic memory cells besides STT-MRAM cells.

Figure 7:
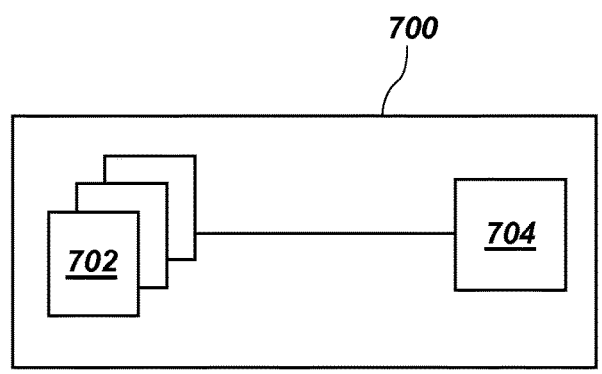
FIG. 7 is a simplified block diagram of a semiconductor device including memory cells having a magnetic cell structure according to an embodiment of the present disclosure.

With reference to FIG. 7, illustrated is a simplified block diagram of a semiconductor device 700 implemented according to one or more embodiments described herein. The semiconductor device 700 includes a memory array 702 and a control logic component 704. The memory array 702 may include a plurality of STT-MRAM cells 614 (FIG. 6) including any of the magnetic cell cores (e.g., the magnetic cell cores 101, 101', 101" of FIG. 1, FIG. 3, and FIG. 4, respectively) discussed above, which magnetic cell cores (e.g., the magnetic cell cores 101, 101', 101") may have been formed according to a method described above and may be operated according to a method described above. The control logic component 704 may be configured to operatively interact with the memory array 702 so as to read from or write to any or all memory cells (e.g., STT-MRAM cell 614 (FIG. 6)) within the memory array 702.

Accordingly, a semiconductor device is disclosed. The semiconductor device comprises an array of magnetic cell structures, each magnetic cell structure comprising a magnetic tunnel junction over an electrode on a substrate, each magnetic tunnel junction comprising a magnetic material over the substrate, a first tunnel barrier material over the magnetic material, a second tunnel barrier material over the first tunnel barrier material, and another magnetic material over the second tunnel barrier material, each magnetic tunnel junction configured to exhibit a tunnel magnetoresistance of between about 180% and about 600% at a resistance area product of less than about 8 ohm μm². The semiconductor device further comprises another electrode over the another magnetic material.

Figure 8:
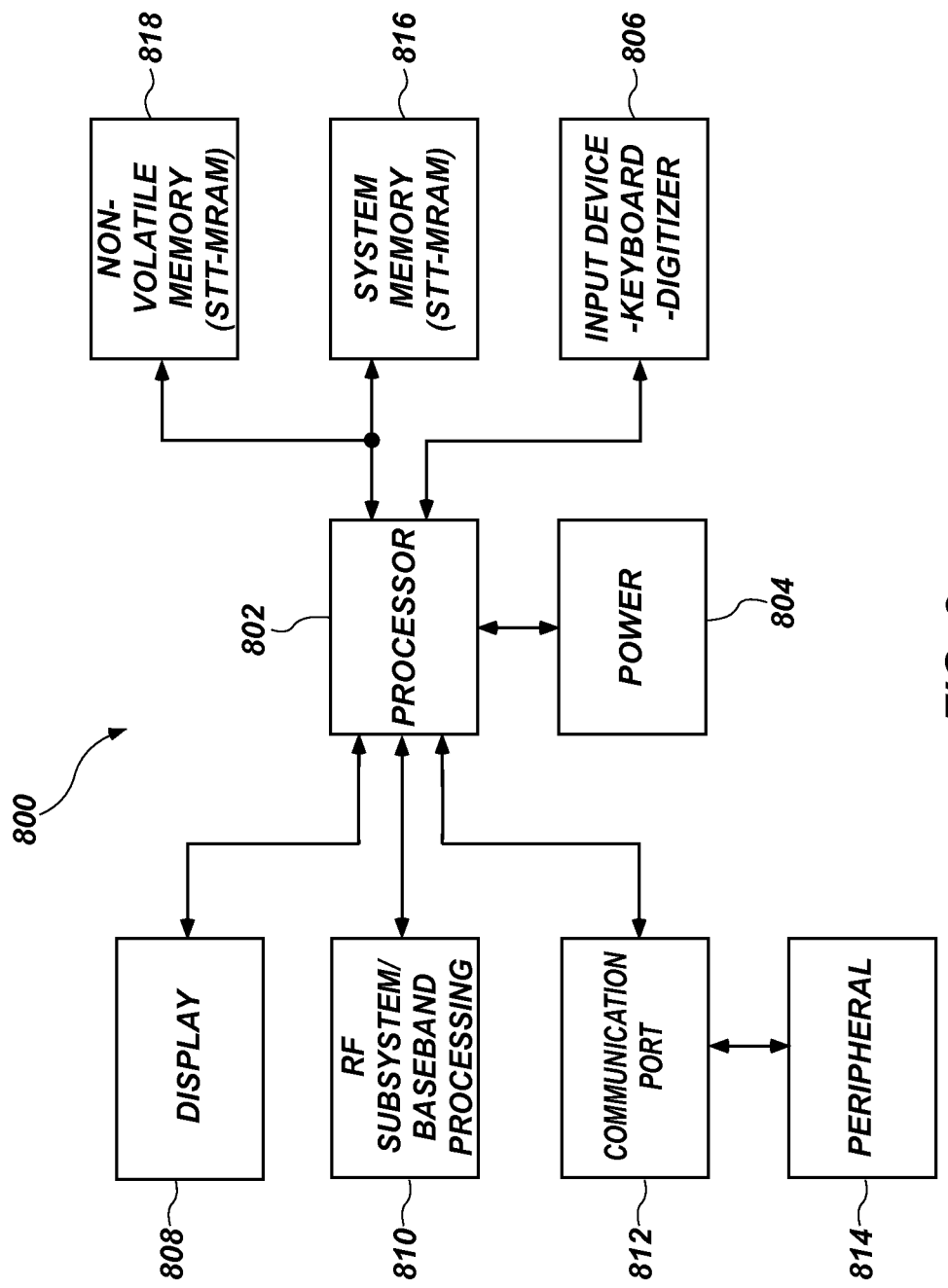
FIG. 8 is a simplified block diagram of a system implemented according to one or more embodiments of the present disclosure.

With reference to FIG. 8, depicted is a processor-based system 800. The processor-based system 800 may include various electronic devices manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include magnetic memory devices manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the semiconductor device 700 of FIG. 7, memory cells including any of the magnetic cell cores 101, 101', 101" of FIG. 1, FIG. 3, and FIG. 4, respectively, described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high capacity memory such as disk drive memory, such as a hybrid-drive including resistive memory or other types of non-volatile solid-state memory, for example. The non-volatile memory 818 may include semiconductor devices, such as the semiconductor device 700 of FIG. 7, memory cells including any of the magnetic cell cores 101, 101', 101" of FIG. 1, FIG. 3, and FIG. 4, respectively, or a combination thereof.

EXAMPLES

Example

Figure 9:
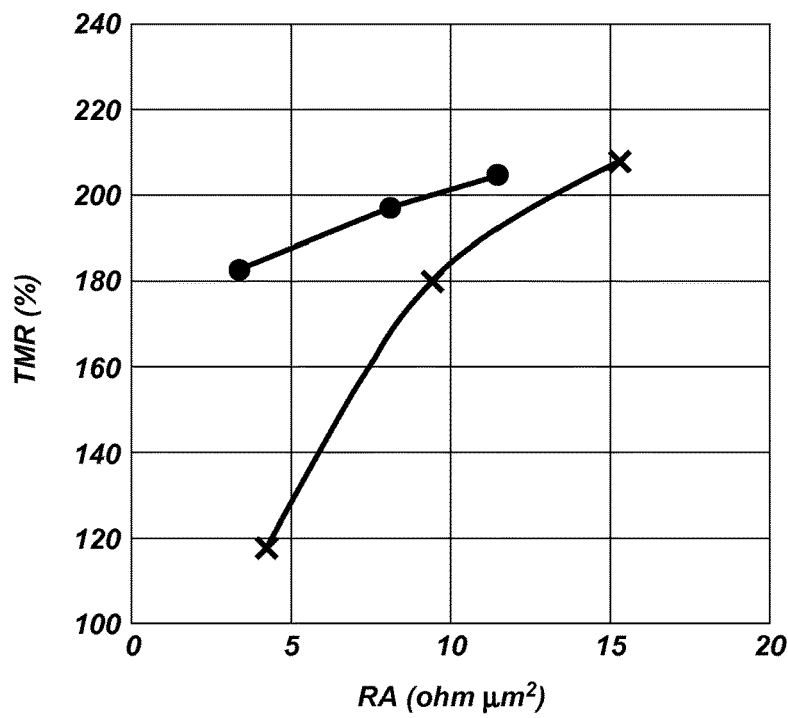
FIG. 9 is a graphical representation comparing the TMR vs. the RA of magnetic tunnel junctions formed according to embodiments of the present disclosure and magnetic tunnel junctions formed by conventional methods.

FIG. 9 is a graphical representation comparing the TMR vs. the RA of MTJs formed according to embodiments of the disclosure to MTJs formed by conventional methods. A MgO tunnel barrier material was formed by RF sputtering at about 20° C. over a CoFeB magnetic material. The MgO and the CoFeB were annealed at a temperature of about 500° C. to crystallize the CoFeB magnetic material in the same crystal orientation as the MgO. A second MgO tunnel barrier material was formed by RF sputtering at about 500° C. over the annealed MgO. Another CoFeB magnetic material was formed over the second MgO tunnel barrier material. A tantalum material was formed over the CoFeB magnetic material and a cobalt/palladium magnetic material was formed over the tantalum to complete the MTJ structure. A conventional MTJ was formed by forming an MgO tunnel barrier material over a CoFeB magnetic material at room temperature. The MgO and the CoFeB were annealed at a temperature of about 500° C. Another CoFeB magnetic material was formed over the MgO. The TMR and the RA of the MTJ structures were measured using conventional techniques. The upper left line of FIG. 9 shows the TMR and the RA of MTJs formed according to embodiments of the disclosure and the lower right line shows the TMR and the RA of the MTJs formed by conventional methods. As shown in the graph, the MTJs formed by the methods disclosed herein exhibit a higher TMR at a lower RA than MTJs formed by conventional methods.

Figure 10:
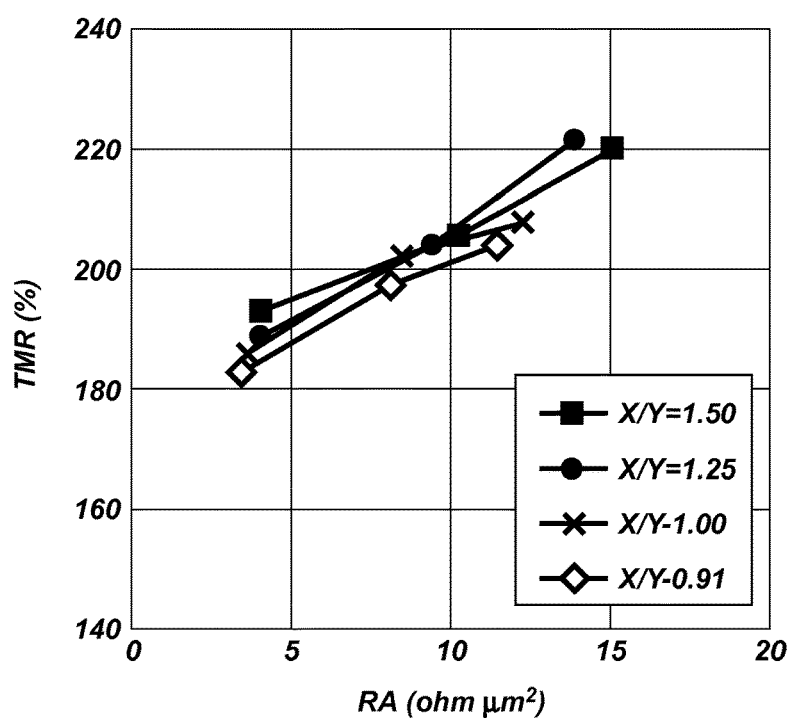
FIG. 10 is a graphical representation of the TMR vs. the RA of magnetic tunnel junctions formed according to embodiments of the present disclosure.

FIG. 10 is a graphical representation of the TMR vs. the RA of MTJs formed according to the present disclosure. A first MgO tunnel barrier material was formed to a first thickness ("X") over a CoFeB magnetic material. The MgO was formed by RF sputtering at about 20° C. The MgO and the CoFeB were annealed at a temperature of about 500° C.

to crystallize the CoFeB in the same crystal orientation as the MgO. A second MgO tunnel barrier material was formed by RF sputtering at about 500° C. over the annealed MgO. The second MgO tunnel barrier material was formed to a second thickness ("Y"). Another CoFeB magnetic material was formed over the second MgO tunnel barrier material. A tantalum material was formed over the CoFeB magnetic material and a cobalt/palladium magnetic material was formed over the tantalum to complete the MTJ structure. The TMR and RA of the MTJ structure were measured by conventional techniques. FIG. 10 graphs the TMR and the RA of MTJs having different ratios of the thickness of the first MgO tunnel barrier material to the thickness of the second MgO tunnel barrier material (i.e., X/Y). Accordingly, the ratio of X/Y may be tailored to form a MTJ exhibiting a desired TMR at a desired RA.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a semiconductor device, the method comprising:
   forming a magnetic material over an electrode on a base material;
   forming, by magnetron sputtering with a magnesium oxide target, a first portion of an oxide tunnel barrier material comprising magnesium oxide over the magnetic material without crystallizing the magnetic material;
   annealing the magnetic material and the first portion of the oxide tunnel barrier material to crystallize the magnetic material and fill oxygen vacancies in the first portion of the oxide tunnel barrier material;
   forming, by magnetron sputtering with the magnesium oxide target, a second portion of the oxide tunnel barrier material comprising magnesium oxide over the annealed first portion of the oxide tunnel barrier material and the crystallized magnetic material, wherein forming the second portion comprises forming the second portion at a higher temperature than forming the first portion of the oxide tunnel barrier material;
   forming another magnetic material over the second portion of the oxide tunnel barrier material; and
   forming another electrode over the another magnetic material.

2. The method of claim 1, wherein forming, by magnetron sputtering with a magnesium oxide target, a first portion of an oxide tunnel barrier material over the magnetic material comprises forming the first portion of the oxide tunnel barrier material at a temperature between about 20° C. and about 25° C.

3. The method of claim 1, wherein annealing the magnetic material and the first portion of the oxide tunnel barrier material comprises exposing the magnetic material and the first portion of the oxide tunnel barrier material to a temperature between about 300° C. and about 600° C.

4. The method of claim 1, wherein annealing the magnetic material and the first portion of the oxide tunnel barrier material comprises crystallizing the magnetic material and the first portion of the oxide tunnel barrier material to exhibit the same crystal orientation.

5. The method of claim 1, wherein annealing the magnetic material and the first portion of the oxide tunnel barrier material to crystallize the magnetic material and fill oxygen vacancies in the first portion of the oxide tunnel barrier material comprises forming the first portion of the oxide tunnel barrier material comprising a stoichiometric oxide tunnel barrier material.

6. The method of claim 1, wherein forming, by magnetron sputtering with a magnesium oxide target, a first portion of an oxide tunnel barrier material over the magnetic material comprises forming the first portion of the oxide tunnel barrier material comprising a nonstoichiometric oxide tunnel barrier material.

7. The method of claim 1, wherein forming a second portion, by magnetron sputtering with a magnesium oxide target, of the oxide tunnel barrier material comprises forming the second portion of the oxide tunnel barrier material comprising a stoichiometric oxide tunnel barrier material.

8. The method of claim 1, wherein forming, by magnetron sputtering with a magnesium oxide target, a first portion of an oxide tunnel barrier material over the magnetic material comprises forming the first portion of the oxide tunnel barrier material comprising an amorphous oxide tunnel barrier material.

9. A method of forming a magnetic tunnel junction, the method comprising:
   forming, at a first temperature, a portion of an amorphous barrier material over an amorphous magnetic material;
   annealing the portion of the amorphous barrier material and the amorphous magnetic material to crystallize the portion of the amorphous barrier material and the amorphous magnetic material;
   forming, at a second temperature, another portion of the barrier material over the crystallized portion of the barrier material, the second temperature greater than the first temperature;
   annealing the another portion of the barrier material to crystallize the another portion of the barrier material; and
   forming another magnetic material over the crystallized another portion of the barrier material.

10. The method of claim 9, wherein forming, at a second temperature, another portion of the barrier material over the crystallized portion of the barrier material comprises forming the another portion of the barrier material at a temperature between about 300° C. and about 600° C.

11. The method of claim 9, wherein:
   forming, at a first temperature, a portion of an amorphous barrier material over an amorphous magnetic material comprises forming, at the first temperature, amorphous magnesium oxide over the amorphous magnetic material; and
   forming, at a second temperature, another portion of a barrier material over the crystallized portion of the barrier material comprises forming, at the second temperature, magnesium oxide over the crystallized portion of the barrier material.

12. The method of claim 9, wherein forming, at a first temperature, a portion of an amorphous barrier material comprises forming the portion of the amorphous barrier material to a thickness between about 1.0 and about 1.5 times a thickness of the another portion of the barrier material.

13. The method of claim 9, wherein:
   forming, at a first temperature, a portion of an amorphous barrier material over an amorphous magnetic material comprises forming the portion of the amorphous barrier material at a temperature between about 0° C. and about 25° C.; and
   forming, at a second temperature, another portion of a barrier material over the crystallized portion of the barrier material comprises forming the another portion of the barrier material at a temperature between about 300° C. and about 600° C.

14. A method of forming a semiconductor device, the method comprising:
   forming a seed material over a substrate;
   forming an amorphous magnetic material over the seed material;
   forming, at a first temperature, a portion of an amorphous oxide material over the amorphous magnetic material;
   forming, at a second temperature between about 300° C. and about 600° C. and higher than the first temperature, another portion of an oxide material over the portion of the amorphous oxide material; and
   forming another magnetic material over the another portion of the oxide material.

15. The method of claim 14, wherein forming another portion of the oxide material comprises forming the another portion of the oxide material to have a thickness less than a thickness of the portion of the oxide material.

16. The method of claim 14, further comprising annealing the amorphous magnetic material and the portion of the amorphous oxide material prior to forming the another portion of the oxide material over the portion of the oxide material.

17. The method of claim 14, further comprising forming a magnetic tunnel junction exhibiting a tunnel magnetoresistance of between about 180% and about 600% at a resistance area product of less than about 8 ohm μm², the magnetic tunnel junction comprising the magnetic material, the portion of the oxide material, the another portion of the oxide material, and the another magnetic material.

18. The method of claim 14, further comprising forming a magnetic tunnel junction exhibiting a tunnel magnetoresistance of between about 180% and about 205% at a resistance area product of between about 4 ohm μm² and about 8 ohm μm², the magnetic tunnel junction comprising the magnetic material, the portion of the oxide material, the another portion of the oxide material, and the another magnetic material.

19. The method of claim 14, wherein forming, at a first temperature, a portion of an amorphous oxide material over the amorphous magnetic material comprises forming the portion of the amorphous oxide material to have a thickness between about 1.0 and about 1.5 times a thickness of the another portion of the oxide material.

* * * * *

UNITED STATES PATENT AND TRADEMARK OFFICE
CERTIFICATE OF CORRECTION

PATENT NO. : 10,439,131 B2
APPLICATION NO. : 14/597903
DATED : October 8, 2019
INVENTOR(S) : Manzar Siddik, Witold Kula and Suresh Ramarajan Page 1 of 1

It is certified that error appears in the above-identified patent and that said Letters Patent is hereby corrected as shown below:

In the Specification
Column 3, Line 18, change "FIG. 5A through" to --FIGS. 5A through--

Signed and Sealed this
Twelfth Day of November, 2019

Andrei Iancu
*Director of the United States Patent and Trademark Office*